United States Patent [19]
Addiss, Jr. et al.

[11] 3,953,652
[45] Apr. 27, 1976

[54] PROCESS FOR COATING GLASS ONTO POLYMERIC SUBSTRATES

[75] Inventors: Richard Robert Addiss, Jr., Bedford; Nedo Peter Albertinetti, Canton, both of Mass.

[73] Assignee: Itek Corporation, Lexington, Mass.

[22] Filed: Sept. 3, 1974

[21] Appl. No.: 502,578

Related U.S. Application Data

[63] Continuation-in-part of Ser. No. 348,431, April 5, 1973, abandoned.

[52] U.S. Cl. ................................. 428/412; 427/42; 427/164; 427/248; 428/426
[51] Int. Cl.² ......................................... B32B 17/06
[58] Field of Search .......... 117/106 R, 93; 427/248, 427/164, 126, 109, 42; 428/412, 426

[56] References Cited
UNITED STATES PATENTS 3,645,779  2/1972  Kienel ............................ 117/106 R
3,713,869  1/1973  Geffcken ....................... 117/106 R

*Primary Examiner*—Cameron K. Weiffenbach
*Attorney, Agent, or Firm*—Homer O. Blair; Robert L. Nathans; David E. Brook

[57] ABSTRACT

Improved techniques for vacuum evaporating glass, using an electron beam to vaporize the glass, onto a polymeric substrate is disclosed. Suitable substrates include ophthalmic lenses formed from polymeric materials such as polymerized CR-39 resin.

The improved technique necessitates the maintenance of certain critical coating conditions. These conditions are: (a) low background pressures; and, (b) an angle of glass vapor impingement below about 40°, measured from the normal; and, (c) an elevated substrate temperature. Additionally, the source glass has a relatively low water content and a relatively low thermal coefficient of expansion.

11 Claims, 5 Drawing Figures

Uncoated, 1 lb.

Glass Coated, 1 lb.

Uncoated, 4 lb.

Glass Coated, 4 lb.

Uncoated, 7 lb.

Glass Coated, 7 lb.

Uncoated, 10 lb.

Glass Coated, 10 lb.

PROCESS FOR COATING GLASS ONTO POLYMERIC SUBSTRATES

CROSS REFERENCE TO RELATED APPLICATIONS

This is a continuation-in-part of my prior U.S. patent application Ser. No. 348,431, filed Apr. 5, 1973 now abandoned.

BACKGROUND OF THE INVENTION

1. Field of the Invention

This invention relates to coatings for polymeric substrates, and more particular to adherent, environmentally stable, optically clear, abrasion resistant, glass coatings for polymeric substrates.

2. Description of the Prior Art

Plastic ophthalmic lenses have become increasingly popular recently due to their excellent optical properties, ease of fabrication, impact resistance, light weight, etc. One serious disadvantage, nevertheless, to plastic ophthalmic lenses has been their susceptibility to abrasion, particularly compared to traditional glass lenses.

Much research has been devoted to providing coatings for plastic lenses to improve their abrasion resistance. An example of one type of coating intended to solve this problem is given in U.S. Pat. No. 3,637,416, to Misch et al. The coatings described in the Misch et al. patent are applied by coating a plastic lens with a bonding or coupling film comprising an organic silicon compound and also coating it with a silica or silica gel.

Another chemical coating designed to improve the abrasion resistance of plastic lenses is given in Krekeler, U.S. Pat. No. 3,713,880. The Krekeler coatings are formed by coating lenses with a solution comprising a mixture of an alkyl silicate, a trifunctional or bifunctional organosilane and an antistatic additive in an organic solvent, followed by solvent evaporation.

A still further chemical-type coating for plastic lenses is described in Crandon et al., U.S. Pat. No. 3,700,487. The Crandon et al. coatings consist of lightly cross-linked polyvinyl alcohols coated onto polycarbonate lens substrates. It is stated that these polyvinyl alcohol coatings provide antifogging characteristics and are also abrasion resistant.

To date, however, none of the chemical coatings has proven totally successful as evidenced by their lack of commercial acceptance. This is probably because of the stringent optical and mechanical property requirements of such coatings.

A very desirable material for coating plastic lenses to increase their abrasion resistance is, of course, glass. The difficulty in forming successful glass coatings on polymeric substrates becomes readily apparent, however, when one considers the many differences between the substrate and coating. For example, there are chemical differences which tend to cause poor adhesion inasmuch as the substrate is an organic polymeric material and the coating is an inorganic, amorphous material. Also, there are significant physical differences, such as the thickness of the glass coating compared to that of the substrate, and even more importantly, the coefficients of thermal expansion of these different materials.

One attempt to provide glass coatings on polymeric substrates is described in U.S. Pat. No. 3,713,869, issued to Geffcken et al. The technique described in the Geffcken et al. patent involves the formation of a delicate intermediate layer formed by producing a glow discharge in a low-molecular organic vapor such as silicic-acid-methyl.

Another attempt at forming glass coatings on plastic substrates is described in Dietzel et al., U.S. Pat. No. 3,522,080. This patent relates to a process of depositing at least 50 successive layers of $SiO_x$ onto a substrate under high vacuum conditions and in the presence of oxygen.

Still another attempt to vacuum deposit glass coatings onto polymer substrates is disclosed in U.S. Pat. No. 3,645,779 to Kienel. This patent teaches the advantages of using as a starting material boron oxide-silicon oxide glass containing less than 5 percent by weight of sodium oxide.

Despite the extensive amount of prior research devoted to providing suitable abrasion resistant chemical coatings, and the more recent efforts to provide glass coatings, there is still a great need for a simple and direct technique for applying thin, adherent, abrasion resistant, environmentally stable, glass coatings to polymeric substrates, particularly plastic lenses.

SUMMARY OF AN EMBODIMENT OF THE INVENTION

An embodiment of this invention relates to an improved vacuum evaporation and deposition process by which abrasion resistant, adherent, optically clear, environmentally stable, glass coatings can be applied to polymeric substrates such as plastic eyeglass lenses.

In general, the type of coating process described herein is a vacuum evaporation and deposition process wherein an electron beam is focused on a source of glass to vaporize the glass and to deposit it on a substrate. All components are contained in vacuum apparatus. The improved coatings of this process require careful control of narrowly defined parameters during the entire coating process.

A first parameter which must be met and maintained throughout the coating process is that the background pressure be kept at low values. Typically, these background pressures must be low enough to yield a mean-free path which is not much shorter than the source-substrate distance.

Secondly, the angle of glass vapor impingement on the substrate should be as close to normal as possible, and in no case should exceed about 40°.

Thirdly, it has been found that elevated substrate temperatures are necessary to obtain environmentally stable glass coatings. The preferred temperature range for the substrate is between 50° and 100°C.

It has also been found that glass having a relatively low water content and a relatively low thermal coefficient of expansion is required if outstanding evaporation characteristics are to be obtained.

The advantages of glass coatings are art recognized. They provide, for example, much improved abrasion and chemical resistance than that of uncoated polymeric substrates. This is particularly desirable with many of the resins currently used or being considered for ophthalmic applications, such as polycarbonates, polymethyl methacrylate and polystyrene. Glass coatings may also be expected to have better resistance to the generation of static surface charges which tend to attract dust particles to lens surfaces.

The most significant advantage of this invention is that it provides a method by which useful thin glass coatings with all of their advantages can be produced directly upon polymeric substrates. Coatings prepared by these techniques, for example, have outstanding adhesion to the substrate, capable of withstanding exceptionally stringent environmental tests as described herein. The coatings are also economical and can be directly and easily applied operating within the process limitations described herein.

DESCRIPTION OF THE INVENTION

Figure 1:
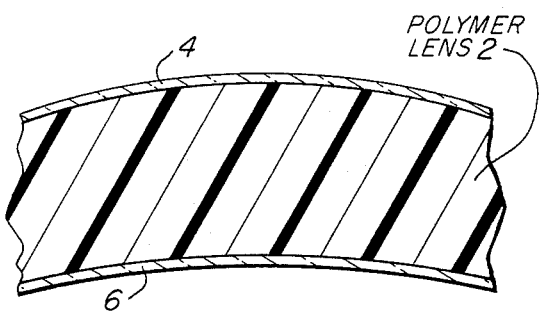
FIG. 1 illustrates, in diagrammatic form, a plastic ophthalmic lens coated with adherent, abrasion resistant, glass coatings.

This invention relates to producing glass coatings directly on polymeric substrates.

Many polymeric substrates are suitable. Of particular importance are ophthalmic substrates, such as plastic eyeglass lenses. Some examples of ophthalmic polymers include homopolymers or copolymers of diethylene glycol bis (allyl carbonate), commonly referred to in the trade as CR-39; polymethyl methacrylate; polycarbonates; polystyrenes; etc.

Suitable glasses include borosilicate glasses such as that marketed by Schott under the number 8329 and fused quartz. The only criteria for the glass is that it evaporate and deposit into useful coatings under the conditions described herein.

It has been found, however, that many borosilicate glasses do not evaporate uniformly, but crack, flake, crumble, or boil under the electron beam. It is believed that this behavior is due to relatively high water contents in the source glass, and to relatively high thermal coefficients of expansion. Because of this, it is believed that source glass should contain less than about 0.01 weight percent hydroxyl groups, and preferably less than 0.005 weight percent hydroxyl groups, as determined from IR absorption bands at 2.7–2.8 $\mu$m. In like manner, the thermal coefficient of expansion of source glass should be below $45 \times 10^{-7}/°C$, and preferably below $40 \times 10^{-7}/°C$.

This type of vacuum evaporation and deposition of glass on plastic substrates has been described in general in the prior art. See for example, Geffcken et al., U.S. Pat. No. 3,713,869; and Dietzel et al., U.S. Pat. No. 3,522,080. Because of this, it is unnecessary to describe in detail the general process, and most of the following description will be specific to the improved techniques of this invention.

The first critical limitation of this invention is the background pressure in the coating apparatus. Background pressure is defined as the total pressure within the closed vacuum evaporation apparatus, regardless of the source. The experimental data available indicates that the background pressure must be kept sufficiently low to provide a mean-free path for the evaporated vapor species from the glass which is not substantially shorter than the distance between the source and the substrate. Since the probability of being scattered is directly proportional to the number of molecules populating the volume, the mean-free path is inversely proportional to the background pressure, all other factors being equal. When too large a fraction of the molecules are scattered by background gas before depositing on the substrate, the coating is not likely to be environmentally stable as defined herein.

From the above, it can be seen that the critical background pressure will vary inversely with the source-substrate distance (L). For a source-substrate distance (L) equal to 15 inches, it has been found that the background pressure should be held to values below $3 \times 10^{-4}$ torr, and are preferably held below $2 \times 10^{-4}$ for the best results. If the substrate distance were shorter, such as 7½ inches, the critical pressures could be higher such as $4-6 \times 10^{-4}$ torr.

Those skilled in the art will be able to ascertain the critical pressure for any set of operating conditions following the general principles discussed above.

Others have, of course, recognized the need to begin vacuum coating glass at very low pressures. See Geffcken et al., U.S. Pat. No. 3,713,869, for example, at Col. 5, lines 19–22. Nevertheless, the need to maintain these exceptionally low pressures throughout the entire coating operation has not heretofore been recognized. Furthermore, the background pressure does rise during coating unless special precautions are taken.

As is obvious, background pressure is directly related to the pumping capacity of the vacuum apparatus used. Moreover, background pressure is related to the evaporation rate of glass since oxygen is a byproduct of the evaporation. Because of this, the evaporation rate must be maintained within values which do not raise the pressure above the critical values.

An additional critical parameter has been found to be the angle of incidence. The angle of incidence is that angle at which the vaporized glass strikes the substrate, measured from the normal. To achieve the outstanding coatings produced by this invention, it is necessary to keep this angle below about 40°. Preferably, the angle is kept as close to the normal as possible. Angles within the critical range can be obtained by mounting the lenses in a substantially perpendicular position to the source, and by using angled or curved lens holders when more than one lens is to be coated. The remarkable effect of angle of incidence can be further appreciated by referring to FIGS. 3 and 4, explained in more detail below.

Heating the polymeric substrate to an elevated temperature also improves the environmental stability of glass coatings deposited thereon. With CR-39 lenses, it has been found that coatings are improved if the lens is raised to and maintained at a temperature between 50° and 100°C, and preferably between about 50° to 75°C. Temperatures higher than 100°C can give rise to crazing, sometimes in a cobweb-like pattern, and frequently visible immediately after deposition of the coating.

With some substrates, such as polycarbonate lenses, a prebake has been found to improve the environmental stability of glass coatings. Temperatures of 100°–120°C in air, or 80°–90°C in vacuum, are satisfactory. Such prebaking can be done in the coating apparatus, or prior to introducing the polycarbonate lenses into the coating apparatus.

In addition to the critical parameters mentioned above, there are several other parameters, which although not being critical, can result in even better coatings. As a general proposition, operating within the preferred values for each of the above parameters will accomplish this.

The coating thickness also seems to be important from the point of view of the coated samples withstanding severe environmental tests. Coating thickness can also influence abrasion resistance. It is desirable to have glass coatings at least one micrometer thick, and preferably from about two to above five micrometers for best results.

It is also desirable, although not necessary, to have the highest source temperature consistent with keeping the background pressure within the limits specified above. Higher source temperatures are achieved by focusing the electron beam to a very small spot so that the source temperature is highest for a given power input. Some precautions can usually be taken under these conditions to insure that the electron beam does not penetrate through the source glass thereby exposing other parts of the coating apparatus to electron beam heating.

The particular cleaning technique for the substrate has also been found to influence the final results. Simply wiping the substrate surface of a CR-39 lens with organic solvents such as acetone or methyl ethyl ketone appears to be a preferred method of cleaning these surfaces. On the other hand, exposing such surfaces to glow discharge cleaning or certain acids can be detrimental to the production of environmentally stable glass coatings. As would be expected, the preferred cleaning technique depends largely on the particular polymer to be coated. Polycarbonate substrates cannot be cleaned by wiping with acetone or other polar solvents, but may be cleaned adequately by dipping them into an ultrasonic bath of heptane.

Those skilled in the art will be able to ascertain appropriate cleaning techniques for any set of coating conditions. In general, the following rules should be followed. Care should be taken not to introduce stains and/or smears before coating. Accumulated dust can be blown off using air just before the coating begins. Additional cleaning procedures may be used, if desired, such as: rinsing in a solvent bath; ultrasonic excitation in a solvent bath; machine wiping, using a solvent-soap pad; machine wiping, using a fine-grit abrasive; a jet spray with solvent; and a jet spray with fine-grit abrasive.

The secondary parameters are important but not critical. Those skilled in the art will be able to ascertain using no more than routine experimentation, suitable operating conditions for any particular substrate. The preheating, prebaking and/or cleaning technqiues are, of course, largely governed by the substrate composition.

FIG. 1 illustrates a section of a polymeric ophthalmic lens 2, such as an eyeglass lens, having a glass coating 4 on its outer or convex side and a glass coating 6 on its inner or concave side. Coatings 4 and 6 are adherent, optically clear, and offer the high abrasion resistance of glass. They are also environmentally stable. Coatings 4 and 6 can be applied by the improved glass evaporation and deposition techniques described herein.

Figure 2:
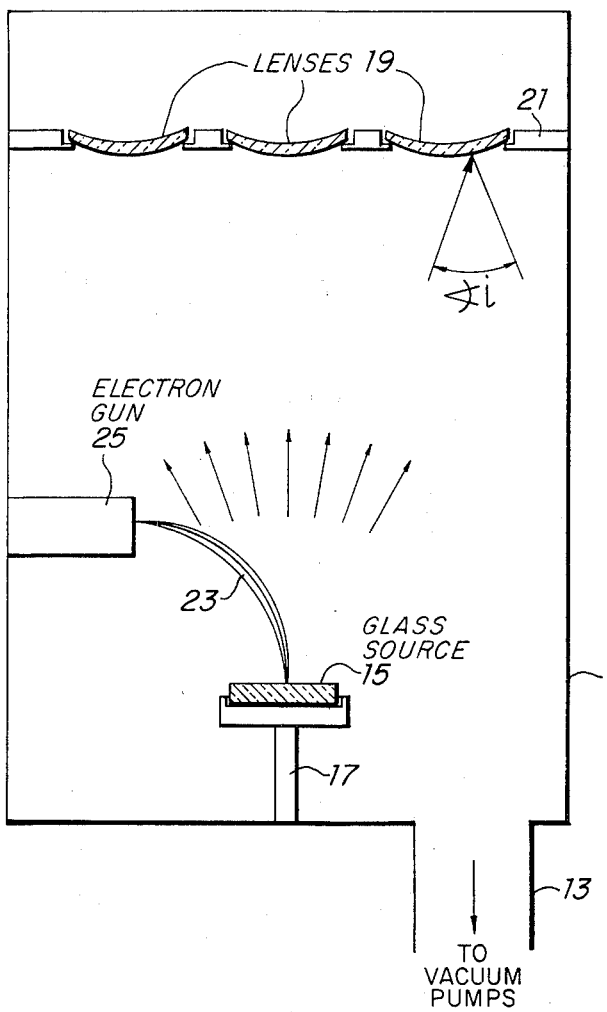
FIG. 2 is a diagrammatic illustration of a vacuum coating apparatus suitable for use in applying glass coatings to polymeric substrates.

A suitable vacuum coating apparatus for applying glass coatings according to this invention is illustrated in FIG. 2. All coating components are enclosed by a vacuum tight outer frame 11 connected to vacuum pumps by outlet 13. Glass source 15 sits on a holder 17 directly below the lenses 19 to be coated. Lenses 19 are held in coating relationship to source 15 by a lens holder 21, which is shown as being straight but which could also be angled towards source 15 at its ends to provide the required angles of incidence. Glass is evaporated from source 15 by bombarding source 15 with electrons 23 furnished by electron gun 25. Electrons 23 are focused to a spot on source 15 by any suitable electron focusing device (not shown) including electromagnetic or electrostatic means. The angle of incidence $\angle i$ is shown for one point on the surface of a lens, and it can be seen that it is the angle at which vaporized glass strikes the surface of the lens measured from the normal. The coating equipment can also be equipped with heating means (not shown) to raise the temperature of the lenses, and an example of suitable heating means is radiant lamps.

One suitable coating apparatus is marketed by Leybold-Heraeus as an A 700 V High Vacuum Coating Plant. Using this apparatus, and positioning CR-39 lenses 15 inches above the glass source, it was found that deposition rates of about 0.5 micrometers/min. were suitable with a pumping capacity of 1000 liters/sec.; with larger pumping capacities, such as 10,000 liters/sec., deposition rates of 2 micrometers/min. or more are possible. Other vacuum coating apparatus is, of course, also suitable.

Figure 3:
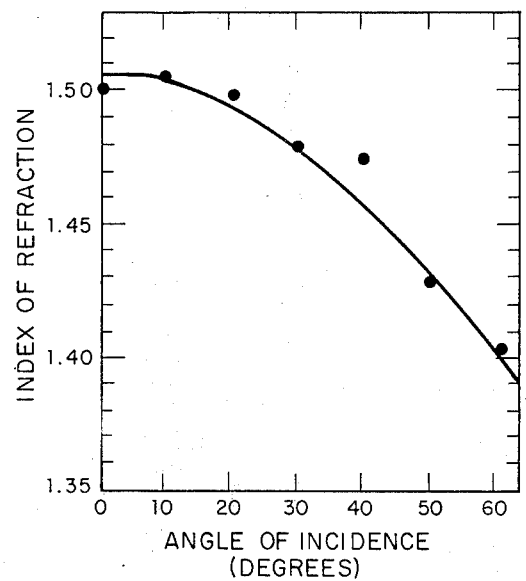
FIG. 3 is a plot illustrating the change in index of refraction with angle of incidence for glass coatings applied by the techniques of this invention.

FIG. 3 is a plot of index of refraction for 2 micrometer glass coatings prepared according to the techniques of Example 1, but deposited on sheets of glass, with everything being held constant except the angle of incidence. As can be seen, the drop in index is remarkable as the angle is raised. The experimental data available is consistent with the hypothesis that the change in index is caused by a lowering of the density of glass coatings as the angle of incidence is increased.

Figure 4:
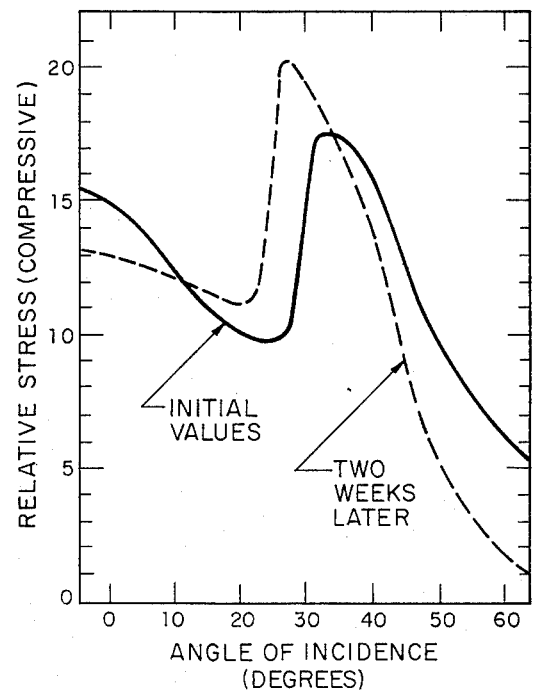
FIG. 4 is a plot illustrating the change in the relative stress pattern with the angle of incidence for glass coatings applied by the techniques of this invention.

FIG. 4 is a plot of relative compressive stress versus angle of incidence for 2 micrometer glass coatings prepared according to the techniques of Example 1, but deposited on a 2 mil Kapton polyimide sheet with everything being held constant except the angle of incidence. As can be seen, there is a hump which starts at angles of incidence of about 30°. This is as yet unexplained. When the coated lenses are heated, the stress drops but subsequently returns to a value close to the initial value for those coatings applied at angles of incidence of less than about 40°. Where the angles are greater than 40°, however, the stress drops rapidly upon heating and actually goes into tension. The reason for this phenomenum is not known, but it may help to explain the failure of lenses coated at angles above about 40° to withstand environmental testing.

Figure 5:
FIG. 5 illustrates actual photographs of uncoated and glass coated CR-39 lenses, both of which were subjected to controlled abrasion resistance testing.
Figure 5:
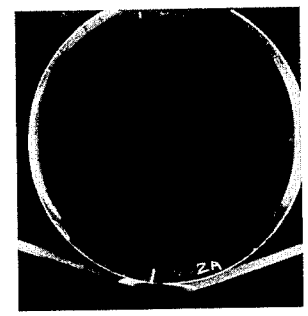
Figure 5:
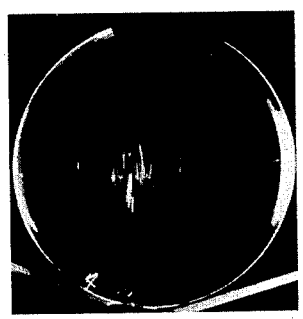
Figure 5:
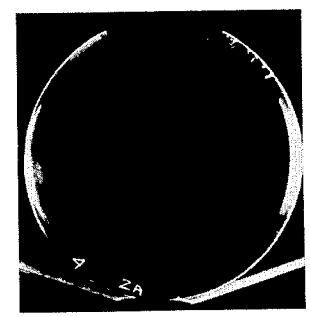
Figure 5:
Figure 5:
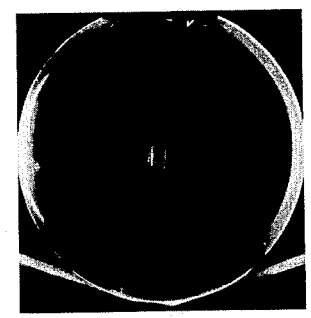
Figure 5:
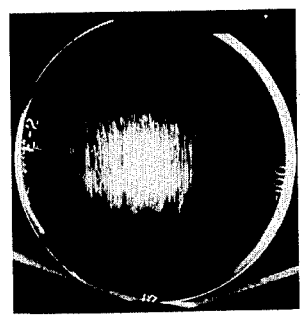
Figure 5:

The advantage in abrasion resistance offered by the glass coatings deposited according to this invention can be appreciated by referring to FIG. 5. The coated CR-39 lenses shown therein were prepared as generally described in Example 1; the coatings were two microns thick (abrasion resistance usually increased with thicker coatings on CR-39 lenses). Abrasion resistance was determined by rubbing the lenses in 1-inch strokes with 1/0 steel wool having a predetermined weight thereon. The abraded lenses were illuminated with red laser light and photographed with a Polaroid camera. In all cases, the lenses were evaluated after 25 cycles with the designated weight applied.

The glass coatings must be, of course, more than abrasion resistant. They must also be environmentally stable. When used herein, the term "environmentally stable" means that the coated substrates withstand the following tests without noticeable adverse effects: (1) a 24-hour bake at 82°C and very low relative humidity such as in an oven; (2) a 24-hour exposure to 95 percent relative humidity at 49°C; (3) a 24-hour exposure to −40°C; and, (4) immersion in boiling water for at least 10 minutes.

The following examples further illustrate the invention.

EXAMPLE 1

The surface of a commercially available polymerized CR-39 eyeglass lens is cleaned by wiping the surface with facial tissue wetted with acetone. The clean lens is placed on the substrate holder in a Leybold-Heraeus A700V High Vacuum Coating Plant, with the lens and source being 15 inches apart. This coating apparatus is generally the same as that illustrated in FIG. 2. The substrate holder is positioned such that the vapor stream from the source impinges as close to the normal as possible.

The coating apparatus is vacuum pumped to a pressure below $10^{-5}$ torr, and the substrate is heated to a temperature between 50° and 60°C by radiant heat. The electron beam is focused to a small spot about ¼ inch diameter on a glass source comprising Schott 8329 borosilicate glass, and the electron beam power is increased until the background pressure is seen to reach about $2 \times 10^{-4}$ torr. This occurs at a beam power of about 400 watts (30 to 40 mA at 12 KV) in the vacuum apparatus of this example (1000 l/s pumping speed). Under these conditions the deposition rate on the substrate 15 inches above the source is between 0.4 to 0.5 $\mu$m/min. A rate of 0.4–0.5 micrometers/min. is used and coating therefore requires 4–5 minutes. The vacuum system is opened to the atmosphere and the sample removed.

Glass coated lenses produced according to the procedure of this example were used in producing the photographs of FIG. 5. As can be seen, the coated lenses have outstanding abrasion resistance compared to uncoated CR-39 lenses. Additionally, the glass coatings on these lenses are environmentally stable.

EXAMPLE 2

The surface of a lens mold formed from polystyrene cross-linked with about 10 percent glycol dimethacrylate is cleaned by wiping the surface with a tissue wetted with methanol. The mold is placed on the substrate holder in an apparatus as shown in FIG. 2 and described in Example 1, such that the surface to be coated faces the glass evaporation source. Pumpdown, heating and deposition of a 2$\mu$m thick glass coating are carried out as described in Example 1 to produce molds having adherent, environmentally stable, abrasion resistant glass coatings.

EXAMPLE 3

A 3 × 3 × ⅛ inch thick sheet of LEXAN polycarbonate is immersed in a bath of heptane and subjected to ultrasonic excitation for about 15 minutes. It is then rinsed with methanol and dried in a stream of warm air. The sheet is placed on the substrate holder in the apparatus shown in FIG. 2 and as described in Example 1, and the coating techniques of Example 1 are used.

The apparatus is vacuum pumped to a pressure below $10^{-5}$ torr, and the substrate is heated to a temperature of about 80°C by radiant heat. The substrate is allowed to remain at this temperature under vacuum for about 3 hours before deposition of the glass coating is begun. Alternatively, the cleaned lens is subjected to an air bake at 120°C for 4 hours or longer, just prior to insertion in the vacuum coating apparatus.

Deposition of the glass is terminated when the coating thickness reaches 4$\mu$m (total deposition time of 8 to 10 minutes). The vacuum system is vented to the atmosphere and the sample removed.

The resulting glass coatings are abrasion resistant, adherent and environmentally stable.

EXAMPLE 4

The procedure of Example 3 is used substituting a polycarbonate eyeglass lens as the substrate. The resulting glass coatings are abrasion resistant, adherent and environmentally stable.

EXAMPLE 5

The general procedure of Example 1 is followed using vacuum equipment having higher pumping capacity. One suitable apparatus is the Leybold-Heraeus Model A2100 HS vacuum coating plant, which has a pumping capacity of about 10,000 liters/sec. In this case the electron beam power can be increased to about 1400 watts (70 mA at 20 KV) before the background pressure reaches about $2 \times 10^{-4}$ torr. Deposition rates are estimated to be in excess of 2$\mu$m/min. at 15 inches.

EXAMPLE 6

A series of CR-39 lenses were coated on the convex side following the general procedure of Example 1 to determine the effect of substrate temperature. The results were:

| Run | Background Pressure ($10^{-4}$ torr) | Initial Substrate Temperature (°C) | Final Substrate Temperature (°C) | Deposition Rate (A/min.) | As Grown | After 24 hrs. Bake at 82°C | After 24 hrs. Bake at 47°C and 93% R.H. | After 24 hrs. at 40°C |
|---|---|---|---|---|---|---|---|---|
| A | 3 | 71 | 95 | — | P | P | F | F |
| B | 2–6 | 18 | 25 | — | P | F | F | — |
| C | 3–4 | 139 | 145 | — | F | — | — | — |
| D | 3–4 | 95 | 117 | 3700 | P | P | P | P |
| E | 2–3 | 71 | 86 | 5000 | P | P | P | P |
| F | 2–2.5 | 64 | 84 | 4000 | P | P | P | P |
| G | 1.5–2.5 | 52 | 68 | — | P | P | P | P |
| H | 2.5–3 | 37 | 60 | 4200 | P | P | P | F |
| I | 1.5–2 | 29 | 40 | 5700 | P | F | F | F |
| J | 2.5–3 | 11 | 47 | 4500 | P | P | P | P |
| K | 1.5–2 | 83 | 98 | 4500 | P | P | P | P |
| L | 3 | 33 | 85 | — | F | — | — | — |
| M | 3–6 | 23 | 60 | — | P | F | F | F |

-continued

| Run | Background Pressure ($10^{-4}$ torr) | Initial Substrate Temperature (°C) | Final Substrate Temperature (°C) | Deposition Rate (A/min.) | As Grown | After 24 hrs. Bake at 82°C | After 24 hrs. Bake at 47°C and 93% R.H. | After 24 hrs. at 40°C |
|---|---|---|---|---|---|---|---|---|
| N | 1.5–3 | 112 | 121 | 4700 | P | P | P | P |

P = Pass   F = Fail

As can be seen from the table, occasionally a coating deposited outside the critical temperature range is environmentally stable, but the results of many such experiments indicate that, on a statistical basis, the operative limits for substrate temperature are 50° and 100°C.

EXAMPLE 7

Attempts were made to coat CR-39 lenses following the general procedures of Example 1 but using glasses other than Schott 8329. Corning No. 7740 glass boiled rigorously during evaporation, and Corning 7913 also boiled although less vigorously resulting in splattering of molten glass droplets onto the substrate. IR absorption spectra of glass samples 2.8 mm. thick produce transmittance minima at 2.7 to 2.8 $\mu$m which are due to water, and such spectra indicate that Corning No. 7740 has more than 10 times as much water present as Schott 8329 glass.

EXAMPLE 8

The general procedure of Example 1 was followed except that different glasses were substituted for the Schott 8329 glass. Glasses used included Corning Nos. 7052, 7056 and 7059, which are reported to have coefficients for thermal expansion of $46 \times 10^{-7}$, $51.5 \times 10^{-7}$, and $46 \times 10^{-7}$/°C, respectively, as well as high content. Under electron beam bombardment, the thermal shock caused hot flakes of solid glass fly off the source which caused the glasses to completely shatter before melting. For this reason, these glasses with relatively high thermal coefficients of expansion were unsatisfactory.

EXAMPLE 9

The general procedure of Example 1 was followed except that GE 125 fused quartz was substituted for Schott 8329 glass. Similar results to Example 1 were obtained.

What is claimed is:

1. A process for applying a glass coating to a polymeric substrate in vacuum evaporation and deposition apparatus, comprising:
   a. placing a source of glass in said apparatus, said glass containing below about 0.01 percent water and having a thermal coefficient of expansion below about $45 \times 10^{-7}$/°C;
   b. positioning said substrate at a finite distance from said source and in such a location that vaporized glass species strike the surface of said substrate to be coated at an angle of less than about 40° measured from the normal;
   c. reducing the background pressure in said equipment to at least a value which provides vaporized glass species with a mean-free path not substantially shorter than said finite distance;
   d. heating said substrate to an elevated temperature of between about 50° and 100°C; and,
   e. vaporizing glass from said source at a rate consistent with maintaining the background pressure below the value established in step (c) until a glass coating has been deposited on said substrate to the desired thickness.

2. The process of claim 1 wherein background pressure is maintained during coating at a value of below about $2 \times 10^{-4}$ torr.

3. The process of claim 1 wherein said vaporizing is accomplished by bombarding said glass with electrons.

4. The process of claim 3 wherein the background pressure is maintained during coating below about $3 \times 10^{-4}$ torr.

5. The process of claim 4 wherein said polymeric substrate comprises an ophthalmic lens.

6. The process of claim 5 wherein said glass is deposited until said coating has a thickness of from about 2 to about 5 micrometers.

7. The process of claim 6 wherein said ophthalmic lens is formed from polymerized diethylene glycol bis (allyl carbonate).

8. The process of claim 6 wherein said ophthalmic lens is formed from polycarbonate.

9. The process of claim 6 wherein said ophthalmic lens is cleaned prior to coating with an organic solvent.

10. An ophthalmic lens having a glass coating thereon formed by the coating process of claim 6.

11. An ophthalmic lens having a glass coating thereon formed by the coating process of claim 1.

* * * * *